United States Patent [19]

Tsang

[11] 4,282,541
[45] Aug. 4, 1981

[54] PLANAR P-I-N PHOTODETECTORS

[75] Inventor: Won-Tien Tsang, New Providence, N.J.

[73] Assignee: Bell Telephone Laboratories, Incorporated, Murray Hill, N.J.

[21] Appl. No.: 106,704

[22] Filed: Dec. 26, 1979

[51] Int. Cl.³ .......................................... H01L 27/14
[52] U.S. Cl. ...................................... 357/30; 357/16; 357/56; 357/58
[58] Field of Search ........................ 357/30, 58, 16, 56

[56] References Cited

U.S. PATENT DOCUMENTS

| | | | |
|---|---|---|---|
| 3,549,960 | 12/1970 | Wedlock | 317/235 |
| 3,959,794 | 5/1976 | Chrepta et al. | 343/701 |
| 4,107,721 | 8/1978 | Miller | 357/30 |
| 4,107,723 | 8/1978 | Komath | 357/30 |
| 4,127,862 | 11/1980 | Ilegems | 357/30 |
| 4,156,310 | 5/1979 | Komath | 29/572 |

OTHER PUBLICATIONS

Sharma, *Semiconductor Heterojunctions*, Pergamon Press, 1974, pp. 133–137.

*Primary Examiner*—Martin H. Edlow
*Attorney, Agent, or Firm*—Michael J. Urbano

[57] ABSTRACT

A light transducer (10) is described in which a semi-insulating, single crystal body (12) of light-absorbing semiconductor material has a pair of spaced-apart epitaxial zones (14, 16) of opposite conductivity type integrally and electrically coupled to a surface (18) of the body. The zones, which may be mesas epitaxially grown on the surface or regions diffused or ion-implanted in the surface, are positioned so that radiation (20) absorbed between them generates photocarriers which are able to diffuse and/or drift to the zones. Also described is an array of transducers in which the photovoltages developed across a plurality of pairs of zones are added in series.

7 Claims, 4 Drawing Figures

PLANAR P-I-N PHOTODETECTORS

BACKGROUND OF THE INVENTION

This invention relates to light responsive transducers for converting optical energy (e.g., light, whether visible radiation or not) to electrical energy (e.g., a photovoltage or photocurrent).

Optical-to-electrical energy transducers cover a broad spectrum of devices ranging from electron photomultipliers to semiconductor photodetectors. The latter class includes two basic types of p-n junction devices: (1) the photovoltaic device (or solar cell) which requires no external voltage source but rather itself is a voltage source when exposed to radiation of a suitable spectral distribution; and (2) the photodiode which is widely used under reverse bias conditions for high-speed detection of both coherent and incoherent optical signals. These semiconductor devices have been fabricated in either a homojunction or heterojunction configuration from a variety of materials such as Si, GaAs/AlGaAs, CdS/Cu$_2$S, SnO/Si, InSnO/InP, and many others. Both configurations have utilized p-i-n multilayered structures in which radiation is made incident either normal to the layers, as in solar cell applications, or parallel to the layers, as in edge-illuminated photodiodes.

The p-i-n photodiode is the most common depletion-layer photodetector because the depletion region thickness can be tailored to optimize the sensitivity range and frequency response. In operation, radiation to be detected is absorbed in the i-layer where it generates electron-hole pairs. These pairs, which are produced in the depletion region or within a diffusion length of it, are eventually separated by the electric field, leading to current flow in the external circuit as carriers drift across the depletion layer. If the external circuit is open, an open circuit voltage will develop between the contacts to the n- and p-layers. The magnitude of this open circuit voltage V$_{oc}$ (the maximum output voltage) for the case of a single, ideal junction is given by $$V_{oc} = n \frac{kT}{q} \ln\left(\frac{I_L}{I_S} + 1\right)$$

where I$_S$ is the reverse saturation current, n is the diode ideality factor, I$_L$ is the photocurrent generated by the device, q is the electronic charge, k is the Boltzmann constant, and T is the absolute temperature. From the above equation, it is apparent that for a fixed I$_L$, V$_{oc}$ cannot be easily increased to arbitrarily large values because I$_S$ is a fixed physical parameter. For a single GaAs junction, for example, V$_{oc}$ is usually of the order of 1.1–1.2 V. But, higher output voltages may be desirable in some applications where, for example, the photodiode is used to power other electronic equipment as well as to perform signal detection. To attain higher voltages, a series of photodiodes may be connected in series. If the photodiodes are discrete, the configuration has the disadvantage that beam splitters are required to direct a portion of the radiation to each photodiode. On the other hand, if the photodiodes are stacked, then they must be interleaved with tunnel junctions as described by M. Illegems et al in U.S. Pat. No. 4,127,862, issued on Nov. 28, 1978, and assigned to the assignee hereof.

As mentioned previously, p-i-n photodiodes may be either normal incidence or edge-illuminated devices. However, edge-illuminated devices are not usually preferred because of the low optical coupling efficiency into the thin i-layer. On the other hand, coupling into a normal-incidence device is typically achieved through the hole in an annular metal contact on either the p- or n-layer, or through the spaces between a comb-like metal contact. The latter type of contact is commonly used in solar cells to reduce absorption in the metal and to achieve large area cells. This type of contact on a heterojunction solar cell is depicted in FIG. 7.1, page 134, of a book by B. L. Sharma et al, *Semiconductor Heterojunctions* (Pergamon Press, 1974). One difficulty with this type of structure arises from the wide bandgap top layer often used to reduce surface recombination at the light-incident surface of the narrower bandgap underlying layer; that is, the radiation to be detected is filtered by the top layer and thus, in solar cell applications especially, reduces the efficiency with which photocarriers are generated.

Another drawback to the normal-incidence scheme arises from the trade-off between speed of response and efficiency of absorption. More specifically, fast response requires that the carrier transit time delay in the depletion layer should be short. This end is accomplished by having the depletion layer thin. However, thin depletion layers do not efficiently or completely absorb the incident radiation, thus resulting in a relatively small photocurrent. Furthermore, a thin depletion layer increases the device capacitance, which further increases the RC time constant.

In contrast, with the edge-illuminated scheme, the incident radiation that falls on the i-layer is totally absorbed since in this parallel direction, the i-layer is thick. In the vertical direction, the depleted i-layer can be made thin so that the transit time delay is short. However, as pointed out above, because the i-layer is thin, most of the incident light is not coupled into the layer.

SUMMARY OF THE INVENTION

In accordance with an illustrative embodiment of my invention, a photodetector includes a semi-insulating single crystal body of light-absorbing semiconductor material and spaced-apart, single crystal p- and n-type zones integrally and electrically coupled to a major surface of the body. The zones, which may be mesas epitaxially grown on the surface or regions diffused or ion-implanted into the surface, are positioned so that light absorbed between the zones generates photocarriers which are able to move (diffuse and/or drift) to the zones and generate a photovoltage thereacross. The distance separating these zones differs depending on whether the device is to function as a solar cell or as a signal detector, but in either case is not greater than the sum of the diffusion lengths of holes and electrons in the light-absorbing material.

BRIEF DESCRIPTION OF THE DRAWINGS

My invention, together with its various features and advantages, can be readily understood from the following more detailed description taken in conjunction with the accompanying drawings, in which.

DETAILED DESCRIPTION

Figure 1:
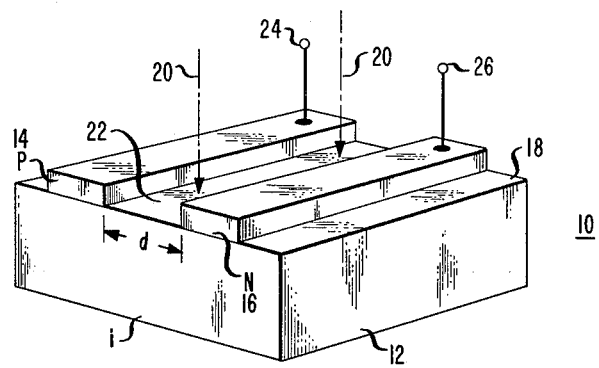
FIG. 1 is a schematic isometric view of an illustrative embodiment of my invention in which p- and n-type zones are formed as mesas on a major surface of a semi-insulating body.

With reference now to FIG. 1, there is shown a p-i-n photodiode or solar cell 10 comprising a semi-insulating, single crystal body 12 of light-absorbing semiconductor material. A pair of spaced-apart, elongated p- and n-type zones 14 and 16 are integrally and electrically coupled to different localized portions of the same major surface 18 of body 12. Illustratively, these zones are epitaxially grown as mesas 14 and 16 on major surface 18 of body 12. Radiation 20 to be detected or converted to electrical power is made incident on the major surface 18 and is absorbed by at least the portion 22 of the body 12 between the mesas 14 and 16. This absorption process generates photocarriers, holes and electrons, which are able to move (diffuse and/or drift) to the p-mesa 14 and n-mesa 16, respectively, thereby generating a photovoltage across electrodes 24 and 26 which contact the mesas. In order to insure that most of the absorption takes place in the semi-insulating body, the mesas should have a small area relative to that of portion 22 and/or should be made of material essentially transparent to the radiation 20 being detected.

When device 10 is used as a solar cell (power converter), the mesas 14 and 16 are preferably separated from each other by a distance $d \leq (L_{De} + L_{Dh})$, where $L_{De}$ and $L_{Dh}$ are the diffusion lengths of electrons and holes, respectively, in the light-absorbing material of body 12. On the other hand, when device 10 is used as photodiode (signal detector) under reverse biased conditions, the separation between the mesas (which define the lateral extent of the depletion region) is tailored to optimize the sensitivity and frequency response. For large photocurrents, the detecting area (mesa separation) should be large. For high speed response, the depleted i-region between the mesas should be narrow so that the carrier transit time is short. The photocarriers generated within the depleted region will give rise to a drift current, while the photocarriers generated outside the depleted region, and within a diffusion length $L_{De}$ (usually longer than $L_{Dh}$) in the bulk semiconductor of body 12, will diffuse into the reverse-biased junction and give rise to a diffusion current.

In order to detect radiation in the wavelength range of approximately 0.8–0.9 μm, body 12 may comprise Si or GaAs, and mesas 14 and 16 may comprise Si or $Al_xGa_{1-x}As$ ($0 \leq X \leq 1$), respectively. (The maximum values of $L_{Dh}$ and $L_{De}$ are of the order of 1 cm for Si and of the order of 100 μm in GaAs according to S. M. Sze, "Physics of Semiconductor Devices," Wiley Interscience, 1969.) For longer wavelengths in the range of 1.0–1.6 μm, body 12 may comprise InGaAsP with the mesas 14 and 16 made of InP. Other combinations of materials may also be appropriate depending upon the wavelength of the radiation to be detected. The above materials are also suitable for solar cell applications which operate to detect sunlight which contains a broad range of wavelengths from infrared to ultraviolet. In any case, it is preferable that the materials of the mesas and body 12 be essentially lattice-matched to one another to reduce defects at the interface between body 12 and the mesas, and thereby allow for the efficient collection of photocarriers.

Figure 2:
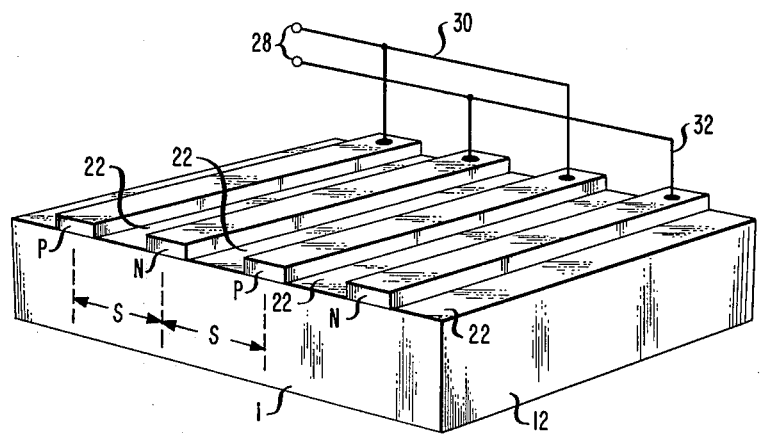
FIGS. 2 and 3 are schematic isometric views of two other embodiments in which the basic unit of FIG. 1 is extended to form a series of structures in which the photovoltages are added.
Figure 3:
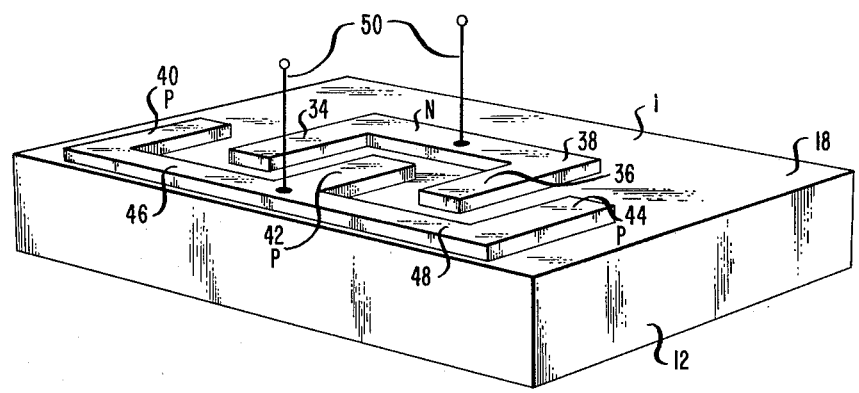

The structure of FIG. 1 is readily fabricated by molecular beam epitaxy (MBE) utilizing, for example, a shadow masking technique described by W-T Tsang et al in *Applied Physics Letters*, 31, 301 (1977). Briefly, this technique involves positioning a planar silicon mask in close proximity to, but not in contact with, the major surface 18 of body 12. The silicon mask has an aperture extending therethrough which defines the shape of mesas 14 or 16. With the mask aperture positioned over the desired location of mesa 14, for example, the body 12 and mask are mounted in an ultrahigh vacuum chamber adapted in well-known fashion for MBE growth. The chamber pressure is typically reduced to about $10^{-9}$ Torr., body 12 is heated to a suitable growth temperature and the effusion cells are heated to generate molecular beams including the constituents of mesa 14. These beams impinge upon surface 18 through the aperture in the mask and thereby epitaxially grow p-type mesa 14. The effusion cells are shuttered closed and, using a standard mechanical manipulator, the mask may then be shifted to the right so as to position the aperture over the desired location of mesa 16. The shutters are then opened on a different set of effusion cells so as to generate molecular beams of the constituents of mesa 16. As before, these constituents epitaxially grow mesa 16 through the aperture in the shadow mask. If desired, planar metal electrodes (not shown) to the mesas 14 and 16 may be deposited in situ utilizing the same shadow mask and a separate effusion cell containing appropriate metallic components.

Where a plurality of pairs of mesas 14 and 16 are to be deposited on major surface 18, as shown in FIG. 2, the shadow mask may readily be designed to include a plurality of elongated parallel apertures spaced-apart by a distance (2S) equal to twice the distance (S) between adjacent mesas. Using such a mask, a plurality of p-type mesas, for example, would first be simultaneously deposited by MBE, and the mask would be shifted laterally a distance (S) equal to the desired distance between p- and n-type mesas. Then a plurality of n-type mesas would be simultaneously grown between the p-type mesas in interdigitated fashion. By electrically connecting all of the p-type mesas to one another and all of the n-type mesas to one another, the photodetectors are connected in series thereby causing the photovoltage at terminals 28 to be essentially the sum of the photovoltages of the individual p-i-n photodetectors. In FIG. 2, this interconnection is depicted schematically by the conductors 30 and 32 which, of course, may be multilevel planar conductors deposited in well-known fashion on major surface 18. Alternatively, as shown in FIG. 3, the series interconnection of the n-mesas 34 and 36 with one another may be effected by epitaxially growing a lateral segment 38 of the same material utilizing a suitably designed shadow mask. In a similar fashion, the p-mesas 40, 42, and 44 may be joined by epitaxial lateral segments 46 and 48. In this case, the photovoltage across terminals 50 is again essentially the sum of the photovoltages of the individual p-i-n detectors.

The various embodiments of my invention have the advantage that the light-absorbing, major surface 18 is readily accessible to the radiation to be detected; that is, the i-region 22 between mesas is directly exposed to the radiation, thus enabling the efficient photogeneration of electron-hole pairs which are then able to drift and/or diffuse to the p- and n-mesas. Since most of the i-region is directly exposed to the radiation, there is little, if any, filtering effect which would be caused by transparent window layers used in conventional p-i-n structures. Furthermore, radiation incident on the i-region 22 is also essentially totally absorbed in the body 12 since that material is thick relative to an absorption length of the radiation. In contrast, in normal-incidence photodiodes, the thin i-layer absorbs only a portion of the incident radiation. Compared with the edge-illuminated photodiode, the ability to use a plurality of pairs of mesas on a semi-insulating body results in large area detectors and significantly increases the coupling efficiency of the radiation to the photodetector. Moreover, the individual separation between the p- and n-mesas (the depleted i-regions) can still be made narrow so as to achieve high-frequency response for signal detection applications. And, by connecting the terminals as described in FIGS. 2 and 3 above, the maximum photovoltage can be increased far beyond that achievable with a conventional single cell.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

Figure 4:
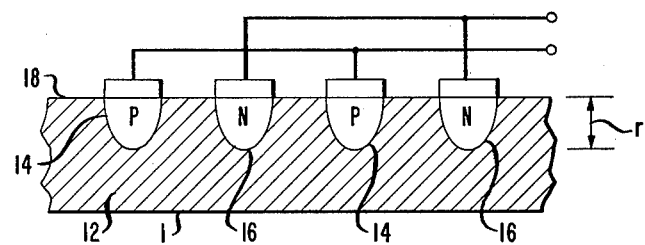
FIG. 4 is a schematic cross-sectional view of yet another embodiment of my invention in which p- and n-type zones are formed in the semi-insulating body (having resistivity $\sim 10^8 - 10^{12}$ ohm-cm), H. C. Casey et al, *J. Vac. Sci. and Tech.*, 15, 1408 (1978).

As an example, instead of p- and n-mesas that are grown epitaxially on the surface of semi-insulating body 12, zones 12 and 14 may be created as elongated p- and n-regions partially embedded within the body 12 so as to intersect surface 18, as shown in FIG. 4. These regions 14 and 16 may be fabricated by well-known diffusion or ion-implantation of appropriate impurities. In this case, the depth r of the zones 14 and 16 should preferably be greater than an absorpiton of length of the radiation in the body 12 so that the region between zones will be more uniformly depleted (depth-wise).

I claim:

1. A light responsive device comprising
   a body of light-absorbing semiconductor material and first and second opposite conductivity type zones contiguous with said body for collecting holes and electrons generated by the absorption of light in said body, characterized in that
   said body comprises single crystal, semi-insulating material having a major surface on which light is made incident,
   said first zone comprises single crystal, p-type semiconductor material which intersects a localized portion of said surface, and
   said second zone comprises single crystal, n-type semiconductor material which intersects a different localized portion of said same surface so that light absorbed between said zones generates holes and electrons which are able to diffuse and/or drift to opposite ones of said zones.

2. The device of claim 1 wherein said zones are separated by a distance which is less than the sum of the diffusion lengths of said holes and electrons.

3. The device of claim 2 comprising a plurality of said first zones and a plurality of said second zones interdigitated with said first zones.

4. The device of claim 3 wherein said zones comprise elongated mesas epitaxially grown on said major surface of said body and further including a lateral mesa segment of said material of said one conductivity type which interconnects said plurality of said first mesas, and a lateral mesa segment of said material of the opposite conductivity type which interconnects said plurality of second mesas to one another.

5. The device of claims 1, 2, or 3 where said zones comprise elongated mesas epitaxially grown on said major surface of said body.

6. The device of claims 1, 2, or 3 wherein said zones comprise regions partially embedded in said body so as to intersect said major surface.

7. The device of claim 6 wherein said regions extend from said surface to a depth at least as great as an absorption length of said radiation in said body.

* * * * *

UNITED STATES PATENT AND TRADEMARK OFFICE
CERTIFICATE OF CORRECTION

PATENT NO. : 4,282,541
DATED : August 4, 1981
INVENTOR(S) : Won-Tien Tsang

It is certified that error appears in the above—identified patent and that said Letters Patent is hereby corrected as shown below:

In the Detailed Description, column 3, line 33, "$d \leqq$ " should read --$d \leqslant$--; in column 3, line 54, "$(0 \leqq x \leqq 1)$" should read --$(0 \leq x \leq 1)$--.
In column 6, line 32, "where" should read --wherein--.

Signed and Sealed this

Twenty-fourth Day of August 1982

[SEAL]

Attest:

GERALD J. MOSSINGHOFF

Attesting Officer     Commissioner of Patents and Trademarks